United States Patent [19]

Leach

[11] 4,172,993

[45] Oct. 30, 1979

[54] ENVIRONMENTAL HOOD FOR TESTING PRINTED CIRCUIT CARDS

[75] Inventor: Paul W. Leach, East Orange, N.J.

[73] Assignee: The Singer Company, Little Falls, N.J.

[21] Appl. No.: 941,758

[22] Filed: Sep. 13, 1978

[51] Int. Cl.² .................. G01R 31/02; G01N 25/00
[52] U.S. Cl. ............................ 324/158 F; 62/248; 73/15 R; 324/73 PC
[58] Field of Search ........... 324/158 F, 73 PC, 158 P; 62/248; 73/15 R

[56] References Cited

U.S. PATENT DOCUMENTS

| | | | |
|---|---|---|---|
| 3,710,251 | 1/1973 | Hagge et al. | 324/158 F |
| 4,115,736 | 9/1978 | Tracy | 324/158 F |

*Primary Examiner*—Rudolph V. Rolinec
*Assistant Examiner*—Ernest F. Karlsen
*Attorney, Agent, or Firm*—Thomas W. Kennedy; Laurence A. Wright

[57] ABSTRACT

In order to permit probing access to a printed circuit board while the printed circuit board is under test in a cold controlled environment, a doubled walled environmental hood is provided, the inner and outer walls spaced apart by rings containing orifices therein, a probe hole formed in the center of the ring and the outer wall cut away in the area of the ring, with a cold gas supplied to the inside of the inner wall and a hot gas supplied to the space between the walls, whereby the hot gas escaping through the orifices in the rings will raise the temperature of the cold gas escaping from the probe hole to prevent frosting and permit viewing of the printed circuit board under test for probing.

12 Claims, 3 Drawing Figures

ENVIRONMENTAL HOOD FOR TESTING PRINTED CIRCUIT CARDS

BACKGROUND OF THE INVENTION

This invention relates to testing in general and more particularly to an environmental hood for use in probing printed circuit cards under test in a cold controlled environment.

In order to meet certain specifications, electronic equipment must be capable of operating to extremely cold temperatures, normally −55° C. In order to carry out such tests it is necessary that various parts of the circuit be probed while in a cold environment. Previous attempts to carry out such testing have not met with complete success. In one method, a clear plastic hood is brought to the test console and placed around the printed circuit board. Cold nitrogen gas is then admitted to the inside of the clear plastic hood in order to bring the circuit board down to the required temperature. With the plastic hood, frosting occurred and it was impossible to observe the printed circuit under test. Furthermore, probing required lifting the hood and thereby allowing the printed circuit card to come above the required temperature.

Another method which has been used is a cold chest in which the printed circuit board has been placed. In such an arrangement, a cable must be brought from the printed circuit board to the test sets. Again, cold nitrogen has been used as the cooling medium. Probing with the cold chest required a long cable run, in addition to making it difficult to probe. The long cable runs in some cases completely destroyed circuit operation, i.e., some printed circuit boards are such that they will not operate through more than a few inches of cable. Thus, there have been serious difficulties in running such tests particularly where automatic, i.e., computer controlled, card test sets were used. Such testing does require probing under temperature extremes. It is thus evident that there is need for an improved system which permits carrying out such testing.

SUMMARY OF THE INVENTION

It is thus an object of the present invention to provide an environmental hood which permits probing printed circuit cards under test in a cold control environment without problems of frosting of the hood and also avoiding long cable runs.

This object is obtained in an environmental hood which can be disposed over a printed circuit card under test which includes an inner wall containing at least one probe hole through which a probe can be inserted, an outer wall surrounding the inner wall, with a spacing therefrom, at least one ring containing at least one opening in the wall thereof disposed between the inner and outer walls and bonded thereto, the ring surrounding the probe holes, means to supply a hot gas to the space between the inner and outer walls. With this arrangement the hot gas will exit through the hole in the ring, be mixed with the cold gas escaping from the probe hole and raise its temperature above the dew point so as to prevent frosting. In this manner an operator is able to continuously view the printed circuit card for probing purposes.

In addition, in the illustrated embodiment of the present invention an adapter plate is provided which receives thereon a printed circuit card connector at which point the electrical interface with the printed circuit card is established. The hood, which is closed on 5 sides is placed in abutting relationship with the adapter plate. The adapter plate contains a plurality of holes in communication with the space between the inner and outer walls. Baffles are disposed on the adapter to direct hot gas escaping through the holes toward the connector at the electrical interface. This prevents frosting of the electrical interface, which frosting could interfere with the circuit operation.

DETAILED DESCRIPTION OF THE INVENTION

Figure 1:
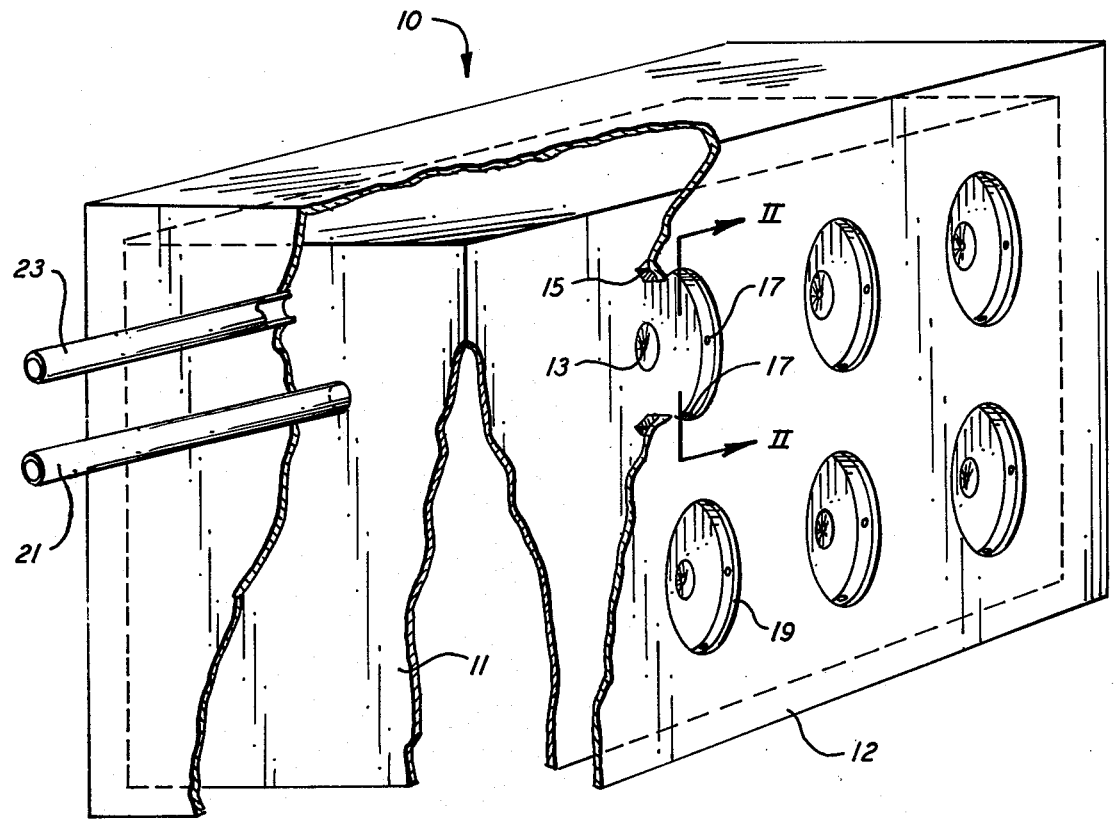
FIG. 1 is a perspective view of the environmental hood of the present invention.

FIG. 1 is a perspective view of the environmental hood of the present invention. As illustrated, it is closed on 5 sides, leaving one side open for placing over a printed circuit card. The hood includes an inner wall 11 and an outer wall 12. The inner wall contains a plurality of holes or openings 13 for the insertion of probes. Essentially concentric with each of the holes 13 is a mixing ring 15, spacing the inner wall 11 from the outer wall 12. The ring is bonded to both the inner and the outer walls. The inner wall, at least, and preferably both walls will be made of a clear plastic material. This permits viewing the printed circuit card under test through the environmental hood.

The rings 15 contain a plurality of holes or openings 17 therein, in the preferred embodiment four holes 17, spaced 90° apart. The outer wall 12 contains opening 19 of a diameter equal to the inner diameter of the mixing ring 15 at the location of each mixing ring to permit access to the probe holes 13. A first inlet tube 21 is brought through the outer wall 12 and the inner wall 11 to permit admitting a cold gas to the space inside the inner wall. A second tube 23 is provided for bringing a hot gas into the space between the inner wall 11 and outer wall 12.

Figure 2:
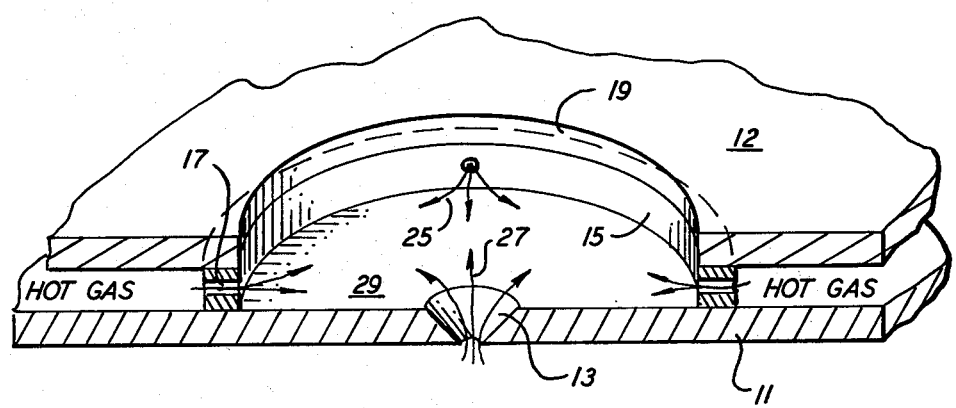
FIG. 2 is a cross-sectional perspective view through a portion of the environmental hood in the area of one of the probe openings.

FIG. 2 is a cross-sectional perspective through a portion of the environmental hood in the area of one of the probe openings 13. Naturally, cold gas will exit through the probe hole 13. With nothing further done, this cold gas would cause frosting and interfere with viewing the printed circuit board for probing. However, the openings 17 in the mixing ring permit hot gas to exit into the space within the mixing ring 15 and to mix with the cold gas coming out of the hole 13. The hot gas indicated by arrows 25 mixes with the cold gas indicated by arrows 27 to raise it above the dew point and prevent frosting. Similarly, the hot gas in the space between the inner wall 11 and the outer wall 12 prevents frosting of these walls. The spaced inside the mixing ring 15 thus forms a mixing chamber 29.

Figure 3:
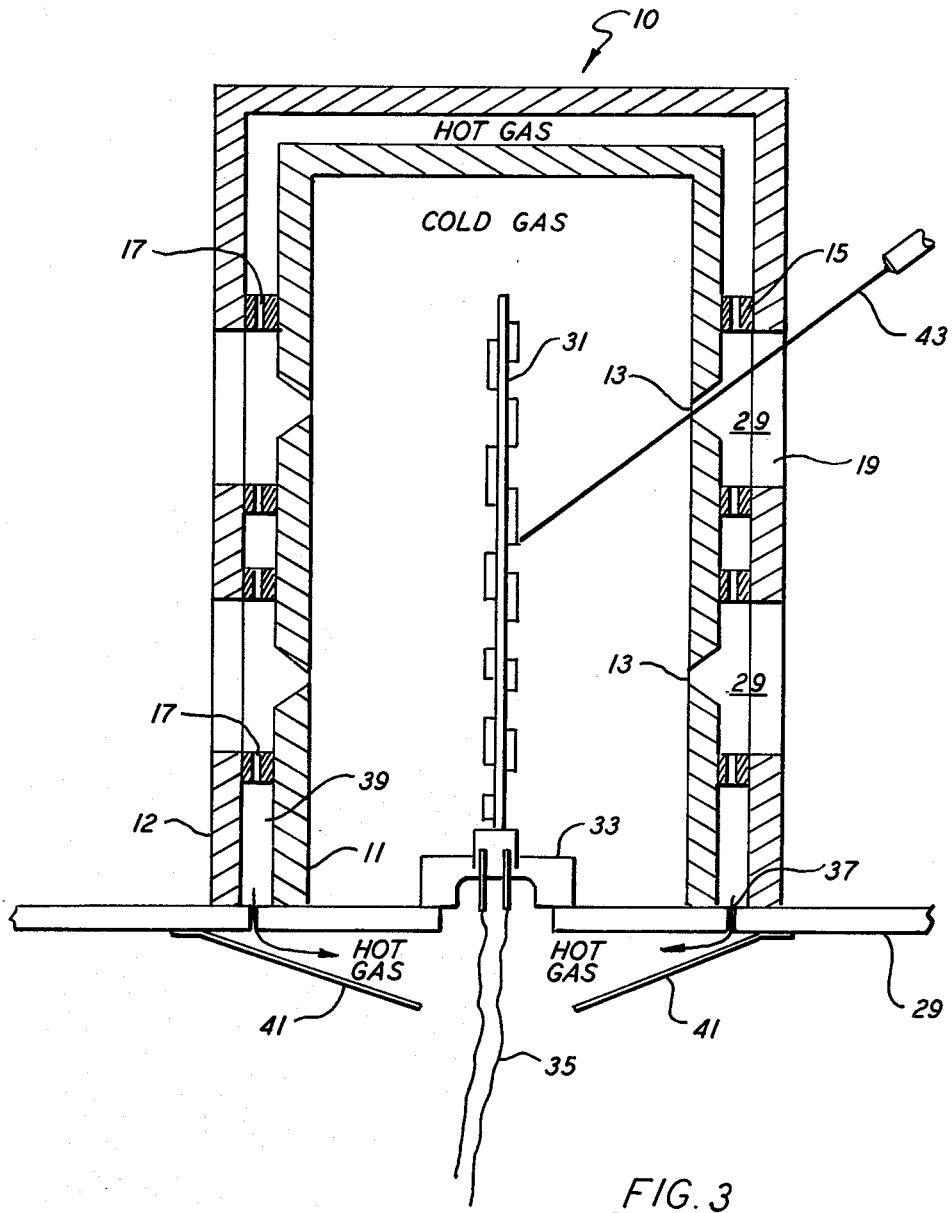
FIG. 3 is a cross-sectional view through the hood of FIG. 1 illustrating its manner of support on an adaptor plate.

A cross-sectional view of the hood of FIG. 1, disposed over a printed circuit board 31 and its manner of support on an adapter plate 29 is illustrated on FIG. 3. FIG. 3 also indicates the manner in which probing is carried out. As illustrated, openings 13, mixing rings 15 and openings 19 are provided on the two long sides of the environmental hood. The adapter plate 29 supports a connector 33 into which the printed circuit board 31 is plugged. Leads for a cable 35 are brought out from the connector. Again, if nothing further was done, since the leads become quite cold, frosting of the electrical leads could take place and interfere with operation of the circuit. To prevent this, the adapter plate 29 contains a plurality of openings 37 which are in communication with the space 39 between the inner wall 11 and outer wall 12. Thus, hot gas will exit through these openings 37. Disposed adjacent the openings 37 are baffles 41 which direct the hot gas to the electrical interface leads 35. The hot gas thus keeps the leads warm and prevents frosting at that point. As is best illustrated by FIG. 3 and as is also evident from FIG. 2, the openings 13 are of a conical shape with the large part of the cone toward the outside of the inner wall 11. As illustrated, this permits a probe 43 being inserted at various angles to contact any desired point on the printed circuit card. Since two rows of holes 13 are provided, one above the other, and since the holes 13 are provided on both sides of the printed circuit board, and also spaced along the length direction of the hood, access to any point on the printed circuit board is possible.

It is also apparent that the size of the rings 15 and the size of the openings 19, along with the angle of conical opening 13, is selected so as to permit access to all points on the board.

As indicated above, the tubes 21 and 23 are provided for supplying a cold gas and hot gas respectively. In both cases the gas supplied should be a dry gas. Also, in both cases it will be under pressure to insure escape through the openings 13 and 17. Dry nitrogen is suitable both for the cold and hot gas. However, any other dry hot or cold gas can also be used. Furthermore, although the mixing rings 15 are shown to be of circular shape and the holes 13 of a conical configuration, it will be recognized that the rings could equally well be square, rectangular, etc., and the openings 13 take the shape of a truncated pyramid for example. Thus, when the word ring is used it simply means a closed spacing member. Similarly, the openings when referred to as tapered toward the outside, can take any possible shape, not only the conical shape shown. Also, although the hood is shown if of a rectangular construction, it should be recognized that hoods of a bubble shape, i.e., with rounded surfaces are also possible. The only requirement is that the hood be closed on all but one side and capable of being placed on an adapter place.

The embodiments of the invention in which an inclusive property or priviledge is claimed are defined as follows:

1. An environmental hood for disposing over a printed circuit card under test comprising:
   (a) a transparent inner wall containing therein at least one probe hole through which a probe can be inserted;
   (b) an outer wall surrounding said inner wall with a spacing therefrom;
   (c) at least one mixing ring containing at least one opening in the walls thereof disposed between said inner and outer walls and bonded thereto, said ring surrounding said at least one probe hole and a hole in the outer wall;
   (d) means to supply a cold gas to the inside of said inner wall; and
   (e) means to supply a hot gas to the space between said inner and outer walls whereby said hot gas will exit through said hole in said ring, be mixed with the cold gas escaping from said probe hole and raise its temperature above the dew point so as to prevent frosting, thereby allowing an operator to see the printed circuit card for probing purposes.

2. Apparatus according to claim 1, wherein said probe hole in said inner wall is tapered toward the outside and the opening in said outer wall and the size of said mixing ring is selected so as to permit a probe to be inserted through said hole at various angles such as to permit reaching a large area on said printed circuit card.

3. Apparatus according to claim 2 wherein a plurality of holes, mixing rings and openings in said outer wall are provided, spaced on said hood such as to permit access to all points on said printed circuit card.

4. Apparatus according to claim 3 wherein said hood is of a rectangular shape having five closed and one open side and wherein a plurality of said holes are spaced along two opposed long sides of said rectangular hood.

5. Apparatus according to claim 4 wherein two rows of holes are provided on each of said opposed sides of said retangular hood.

6. Apparatus according to claim 2 and further including an adapter plate having disposed thereon a printed circuit card connector to accept printed circuit cards such as to be disposed therein perpendicular to said adapter plate and further including a plurality of holes in said adapter plate arranged so as to be in alignment and in communication with the space between said inner and outer walls when said hood is placed in abutment therewith; electrical interface leads for coupling said connector to a test set; and baffles for directing the hot gas escaping from said holes in said adapter plate toward said electrical interface leads to thereby prevent the formation of frost on said electrical interface leads.

7. Apparatus according to claim 2, wherein a plurality of openings are provided in a wall of said ring.

8. Apparatus according to claim 7 wherein four openings spaces 90° apart are provided in the wall of said ring.

9. A method to permit probe testing of a printed circuit card under controlled cold environmental conditions comprising:
   (a) disposing, around the printed circuit card under test, a double walled hood made of a clear material;
   (b) forming an opening in the inner wall of said hood;
   (c) surrounding said opening with a mixing ring containing therein at least one opening and bonding said mixing ring to both said inner and outer walls;
   (d) forming an opening in said outer wall of a diameter no larger than the maximum diameter which permits bonding to said mixing ring;
   (e) supplying a dry cold gas to the space within said inner wall;
   (f) supplying a dry hot gas to the space between said inner and outer walls, whereby, frosting of said inner and outer walls will be prevented, a probe can be inserted through the openings in said outer and inner walls and frosting at the area of insertion of said probe will be prevented by the mixing of the hot dry gas escaping through the openings in said mixing ring with the cold dry gas escaping through the hole through which said probe is inserted and raising it above the dew point.

10. The method according to claim 9 and further including the step of forming the hole in said inner wall with sloped sides; and selecting the size of said mixing ring and selecting the size of the opening in said outer wall so as to permit a probe to be inserted through said outer and inner walls to permit covering and probing a large area on said printed circuit card.

11. The method according to claim 10 and further including disposing a plurality of said holes in said inner wall, and mixing rings and holes in said outer wall at spacings so as to permit access to all points on said printed circuit card.

12. The method according to claim 10 and further including providing an adapter plate containing thereon a connector and electrical interface leads for a printed circuit board, said connector disposed so that said printed circuit board will be disposed essentially perpendicular to said adapter plate; forming a plurality of holes in said adapter plate such as to be in alignment with the space between said inner and outer walls when said hood is placed thereover; disposing baffle plates adjacent said holes in said adapter plate for directing a hot gas escaping therefrom toward said connector and electrical interface leads; placing said hood over said printed circuit card and in abuttment with said adapter plate such that the space between said inner and outer walls is aligned with said holes, whereby, the hot gas supplied between said inner and outer walls will escape through said holes in said adapter plate and be directed by said baffles towards said electrical interface to prevent frost formation thereon.

* * * * *